(12) United States Patent
Kawamura et al.

(10) Patent No.: US 10,535,399 B2
(45) Date of Patent: *Jan. 14, 2020

(54) MEMORY ARRAYS

(71) Applicant: Micron Technology, Inc., Boise, ID (US)

(72) Inventors: Christopher J. Kawamura, Boise, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/137,971

(22) Filed: Sep. 21, 2018

(65) Prior Publication Data

US 2019/0049087 A1 Feb. 14, 2019

Related U.S. Application Data

(63) Continuation of application No. 15/664,140, filed on Jul. 31, 2017, now Pat. No. 10,276,230.
(Continued)

(51) Int. Cl.
*G11C 11/24* (2006.01)
*G11C 11/4097* (2006.01)
(Continued)

(52) U.S. Cl.
CPC ......... *G11C 11/4097* (2013.01); *F21S 41/125* (2018.01); *F21S 41/143* (2018.01);
(Continued)

(58) Field of Classification Search
CPC . G11C 11/403; G11C 11/405; G11C 16/0433; G11C 11/4097; G11C 13/0023;
(Continued)

(56) References Cited

U.S. PATENT DOCUMENTS 4,103,342 A 7/1978 Miersch et al.
4,554,570 A 11/1985 Jastrzebski
(Continued)

FOREIGN PATENT DOCUMENTS

WO PCT/US2017/044611 11/2017
WO PCT/US2017/044633 11/2017
(Continued)

OTHER PUBLICATIONS

Hewes, "Circuit Diagrams", available online at https://electronicsclub.info/circuitdiagrams.htm, Dec. 14, 2018, pp. 1-3.
(Continued)

*Primary Examiner* — Thong Q Le
(74) *Attorney, Agent, or Firm* — Wells St. John P.S.

(57) ABSTRACT

Some embodiments include a memory array having a series of bitlines. Each of the bitlines has a first comparative bitline component and a second comparative bitline component. The bitlines define columns of the memory array. Memory cells are along the columns of the memory array. Capacitive units are along the columns of the memory array and are interspersed amongst the memory cells. The capacitive units are not utilized for data storage during operation of the memory array, but rather are utilized for reducing parasitic capacitance between adjacent bitlines.

16 Claims, 8 Drawing Sheets

Related U.S. Application Data

(60) Provisional application No. 62/381,753, filed on Aug. 31, 2016.

(51) Int. Cl.

| | | |
|---|---|---|
| *G11C 7/02* | (2006.01) | |
| *G11C 11/408* | (2006.01) | |
| *G11C 11/4094* | (2006.01) | |
| *H01L 27/108* | (2006.01) | |
| *F21S 41/25* | (2018.01) | |
| *F21S 41/663* | (2018.01) | |
| *F21S 41/265* | (2018.01) | |
| *F21S 41/37* | (2018.01) | |
| *F21S 41/125* | (2018.01) | |
| *F21S 41/143* | (2018.01) | |
| *F21S 41/255* | (2018.01) | |
| *F21S 41/43* | (2018.01) | |
| *F21S 41/64* | (2018.01) | |
| *G02B 27/18* | (2006.01) | |
| *G11C 11/4091* | (2006.01) | |

(52) U.S. Cl.
CPC ............ *F21S 41/25* (2018.01); *F21S 41/255* (2018.01); *F21S 41/265* (2018.01); *F21S 41/37* (2018.01); *F21S 41/43* (2018.01); *F21S 41/645* (2018.01); *F21S 41/663* (2018.01); *G02B 27/18* (2013.01); *G11C 7/02* (2013.01); *G11C 11/4085* (2013.01); *G11C 11/4094* (2013.01); *H01L 27/108* (2013.01); *G11C 11/4091* (2013.01)

(58) Field of Classification Search
CPC ....... G11C 16/02; G11C 16/30; G11C 11/404; G11C 11/4085; G11C 11/4091; G11C 11/565; G11C 13/0004
USPC ....... 365/149, 203, 145, 72, 230.03, 230.06, 365/104, 189.03, 200, 205, 207, 208, 365/210.1, 63, 129, 148
See application file for complete search history.

(56) References Cited

U.S. PATENT DOCUMENTS

| | | |
|---|---|---|
| 5,066,607 A | 11/1991 | Banerjee |
| 5,299,155 A | 3/1994 | Yanagi |
| 5,389,810 A | 2/1995 | Agata |
| 5,571,743 A | 11/1996 | Henkels et al. |
| 5,586,078 A | 12/1996 | Takase et al. |
| 5,646,900 A | 7/1997 | Tsukude et al. |
| 5,830,791 A | 11/1998 | Lee et al. |
| 6,028,806 A | 2/2000 | Waller |
| 6,141,286 A | 10/2000 | Vo et al. |
| 6,154,387 A | 11/2000 | Takata |
| 6,483,737 B2 | 11/2002 | Takeuchi et al. |
| 6,563,727 B1 | 5/2003 | Roth et al. |
| 6,710,465 B2 | 3/2004 | Song et al. |
| 6,720,609 B2 | 4/2004 | Deboer et al. |
| 6,744,087 B2 | 6/2004 | Misewich et al. |
| 6,961,271 B2 | 11/2005 | Jeon et al. |
| 7,330,388 B1 | 2/2008 | Chapman et al. |
| 7,378,702 B2 | 5/2008 | Lee |
| 7,408,218 B2 | 8/2008 | Akiyama et al. |
| 7,558,097 B2 | 7/2009 | Khellah et al. |
| 7,697,318 B2 | 4/2010 | Fukuda |
| 8,212,311 B2 | 7/2012 | Masuoka et al. |
| 8,394,699 B2 | 3/2013 | Haller et al. |
| 8,866,208 B2 | 10/2014 | Lee |
| 9,343,507 B2 | 5/2016 | Takaki |
| 9,378,780 B1 | 6/2016 | Chang et al. |
| 10,020,311 B1 | 7/2018 | Li et al. |
| 10,157,926 B2 | 12/2018 | Yang et al. |
| 2001/0053088 A1 | 12/2001 | Forbes |
| 2002/0044477 A1 | 4/2002 | Takeuchi et al. |
| 2002/0093865 A1 | 7/2002 | Agata |
| 2003/0087499 A1 | 5/2003 | Lane et al. |
| 2003/0169616 A1 | 9/2003 | Noro |
| 2003/0173593 A1 | 9/2003 | Miyatake |
| 2003/0185041 A1 | 10/2003 | Takahashi et al. |
| 2003/0202391 A1 | 10/2003 | Nishimura et al. |
| 2003/0234413 A1 | 12/2003 | Sberno et al. |
| 2004/0062101 A1 | 4/2004 | Kasuga |
| 2004/0151020 A1 | 8/2004 | Beer |
| 2004/0174733 A1 | 9/2004 | Kirihata et al. |
| 2004/0232497 A1 | 11/2004 | Akiyama |
| 2004/0252542 A1 | 12/2004 | Hoya et al. |
| 2006/0028859 A1 | 2/2006 | Forbes |
| 2006/0046424 A1 | 3/2006 | Chance et al. |
| 2006/0138466 A1 | 6/2006 | Choi |
| 2006/0211194 A1 | 9/2006 | Haller |
| 2007/0034928 A1 | 2/2007 | Cook et al. |
| 2007/0161179 A1 | 7/2007 | Lee |
| 2007/0295995 A1 | 12/2007 | Yun |
| 2009/0008691 A1 | 1/2009 | Lee et al. |
| 2009/0108881 A1 | 4/2009 | Wilson |
| 2009/0168489 A1 | 7/2009 | Madan et al. |
| 2009/0212338 A1 | 8/2009 | Benson |
| 2010/0165704 A1 | 7/2010 | Wu et al. |
| 2010/0238697 A1 | 9/2010 | Juengling |
| 2010/0264484 A1 | 10/2010 | Masuoka et al. |
| 2010/0295110 A1 | 11/2010 | Takaishi |
| 2012/0153371 A1 | 6/2012 | Chen et al. |
| 2013/0099305 A1 | 4/2013 | Kim et al. |
| 2013/0161607 A1 | 6/2013 | Yoneda |
| 2013/0221356 A1 | 8/2013 | Yamazaki |
| 2013/0235641 A1 | 9/2013 | Iwaki |
| 2013/0235642 A1 | 9/2013 | Heineck et al. |
| 2014/0035018 A1 | 2/2014 | Lee |
| 2014/0054718 A1 | 2/2014 | Karda et al. |
| 2014/0220749 A1 | 8/2014 | Rutter |
| 2015/0041885 A1 | 2/2015 | Yoshida et al. |
| 2015/0078056 A1 | 3/2015 | Liu |
| 2015/0318285 A1 | 11/2015 | Zhang |
| 2016/0071843 A1 | 3/2016 | Kadoya |
| 2016/0079247 A1 | 3/2016 | Lim et al. |
| 2018/0061835 A1 | 3/2018 | Yang et al. |

FOREIGN PATENT DOCUMENTS

| | | |
|---|---|---|
| WO | PCT/US2017/044638 | 11/2017 |
| WO | PCT/US2017/044653 | 11/2017 |
| WO | PCT/US2017/044661 | 11/2017 |
| WO | PCT/US2017/045052 | 11/2017 |
| WO | PCT/US2017/068227 | 4/2018 |
| WO | PCT/US2018/041312 | 11/2018 |
| WO | PCT/US2017/044611 | 3/2019 |
| WO | PCT/US2017/044633 | 3/2019 |
| WO | PCT/US2017/044638 | 3/2019 |
| WO | PCT/US2017/044653 | 3/2019 |
| WO | PCT/US2017/044661 | 3/2019 |
| WO | PCT/US2017/045052 | 3/2019 |

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.

Henkels et al., "Large-Signal 2T, 1C DRAM Cell: Signal and Layout Analysis", IEEE Journal of Solid-State Circuits, vol. 29(7), Jul. 1994, pp. 829-832.

MEMORY ARRAYS

RELATED PATENT DATA

This patent resulted from a continuation of U.S. patent application Ser. No. 15/664,140, which was filed on Jul. 31, 2017; and which claims priority to U.S. Provisional Patent Application Ser. No. 62/381,753, which was filed Aug. 31, 2016.

TECHNICAL FIELD

Memory arrays, such as arrays comprising memory cells having two transistors and one capacitor (i.e., 2T-1C memory cells), arrays comprising memory cells having two transistors and two capacitors (2T-2C memory cells), and other memory arrays utilizing comparative bitlines.

BACKGROUND

Dynamic Random Access Memory (DRAM) is utilized in modern computing architectures. DRAM may provide advantages of structural simplicity, low cost and speed in comparison to alternative types of memory.

Presently, DRAM commonly utilizes memory cells having one capacitor in combination with a transistor (so-called 1T-1C memory cells), with the capacitor being coupled with a source/drain region of the transistor. One of the limitations to scalability of present 1T-1C configurations is that it is proving difficult to incorporate capacitors having sufficiently high capacitance into highly-integrated architectures. Accordingly, it would be desirable to develop new memory cell configurations suitable for incorporation into highly-integrated modern memory architectures, and to develop memory array architectures suitable for utilizing such new memory cell configurations.

DETAILED DESCRIPTION OF THE ILLUSTRATED EMBODIMENTS

Some embodiments include memory arrays which include bitlines having a first comparative bitline component and a second comparative bitline component. Data states of memory cells along the bitlines may be ascertained by comparing one or more electrical properties of the first comparative bitline component with electrical properties of the second comparative bitline component, which can omit reference bitlines utilized in other memory configurations (for instance 1T-1C configurations). The memory arrays may include capacitive units interspersed with memory cells, and such capacitive units may be used to reduce or eliminate parasitic capacitance between adjacent bitlines. These and other aspects of the invention are described below with reference to FIGS. 1-10.

Figure 1:
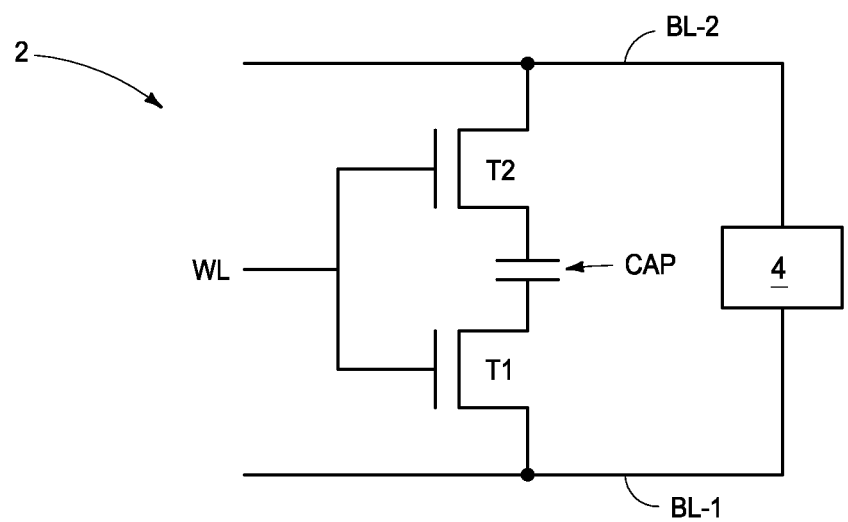
FIG. 1 is a schematic diagram of a prior art memory cell having 2 transistors and 1 capacitor.
Figure 2:
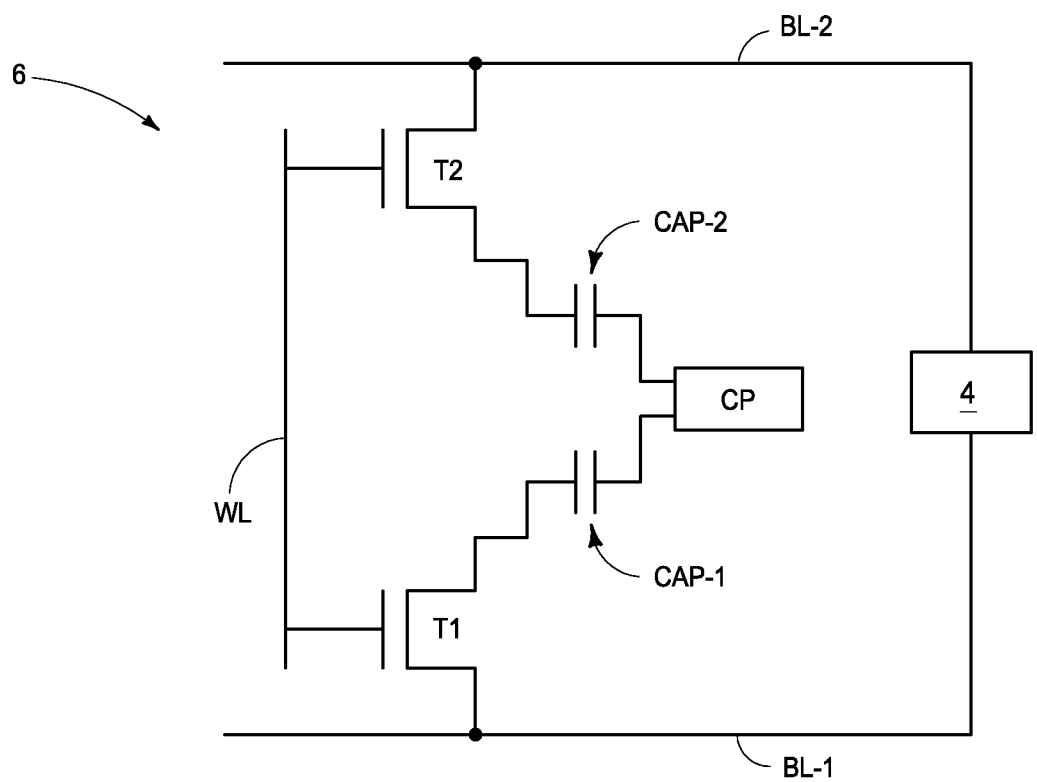
FIG. 2 is a schematic diagram of a prior art memory cell having 2 transistors and 2 capacitors.

FIGS. 1 and 2 illustrate example memory cells which may be utilized in arrangements comprising first and second comparative bitline components. Specifically, FIG. 1 illustrates an example configuration having two transistors and 1 capacitor (a so-called 2T-1C configuration), and FIG. 2 illustrates an example configuration having two transistors and 2 capacitors (a so-called 2T-2C configuration).

Referring to FIG. 1, the example 2T-1C memory cell configuration is schematically illustrated as a memory cell 2 according to the prior art. The two transistors are labeled as T1 and T2.

A source/drain region of T1 connects with a first node of the capacitor (CAP), and the other source/drain region of T1 connects with a first comparative bitline component (BL-1). A gate of T1 connects with a wordline (WL). A source/drain region of T2 connects with a second node of the capacitor (CAP), and the other source/drain region of T2 connects with a second comparative bitline component BL-2. A gate of T2 connects with the wordline (WL).

The comparative bitline components BL-1 and BL-2 extend to circuitry 4 which compares electrical properties (e.g., voltage) of the two to ascertain a memory state of memory cell 2.

Referring to FIG. 2, the example 2T-2C memory cell configuration is schematically illustrated as a prior art memory cell 6. The two transistors of the memory cell are labeled as T1 and T2, and the two capacitors are labeled as CAP-1 and CAP-2.

A source/drain region of the first transistor T1 connects with a node of the first capacitor (CAP-1), and the other source/drain region of T1 connects with a first comparative bitline component (BL-1). A gate of T1 connects with a wordline (WL). A source/drain region of the second transistor T2 connects with a node of the second capacitor (CAP-2), and the other source/drain region of T2 connects with a second comparative bitline component BL-2. A gate of T2 connects with the wordline (WL). Each of the first and second capacitors (CAP-1 and CAP-2) has a node electrically coupled with a common plate (CP). The common plate may be coupled with any suitable voltage, such as a voltage within a range of from greater than or equal to ground to less than or equal to VCC (i.e., ground≤CP≤VCC). In some applications the common plate is at a voltage of about one-half VCC (i.e., about VCC/2).

The comparative bitline components BL-1 and BL-2 extend to the circuitry 4 which compares electrical properties (e.g., voltage) of the two to ascertain a memory state of memory cell 6.

Figure 3:
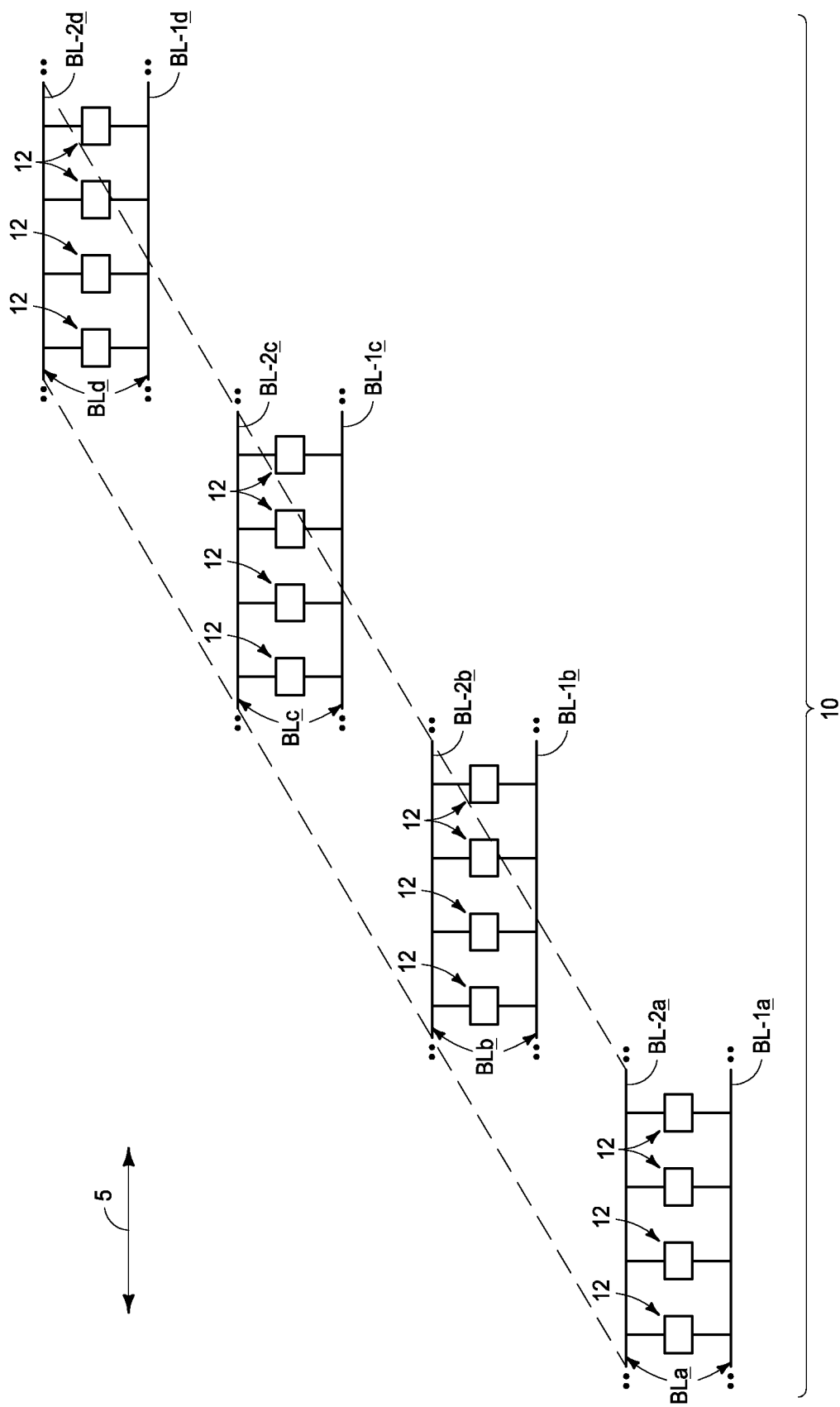
FIG. 3 is a diagrammatic view of a region of a memory array showing an arrangement of bitlines.

The 2T-1C configuration of FIG. 1 and the 2T-2C configuration of FIG. 2 may be utilized in DRAM (dynamic random access memory) arrays and/or other types of memory arrays. A region of an example memory array 10 is shown in FIG. 3.

The memory array 10 includes a series of bitlines (BLa-BLd), with the bitlines defining columns of the memory array. The memory array would also comprise a series of wordlines (not shown); with the wordlines defining rows of the memory array. The bitlines (i.e., the columns of the memory array) extend in a first direction along an illustrated axis 5. The wordlines (i.e., the rows of the memory array, which are not shown in FIG. 3) would extend in a second direction which intersects the first direction, and in some embodiments may extend in a direction substantially orthogonal to the direction of the bitlines.

Each of the bitlines comprises first and second comparative bitline components. Specifically, the comparative components of bitline BLa are labeled as BL-1a and BL-2a; the comparative components of bitline BLb are labeled as BL-1b and BL-2b; the comparative components of bitline BLc are labeled as BL-1c and BL-2c; and the comparative components of bitline BLd are labeled as BL-1d and BL-2d. The comparative bitline components extend to circuitry 4 of the type described above with reference to FIGS. 1 and 2. Such circuitry is not shown in FIG. 3 in order to simplify the drawing.

Memory cells 12 are between the comparative bitline components and along the columns of the memory array 10. The memory cells may comprise any suitable configurations; and in some embodiments may be 2T-1C configurations of the type described in FIG. 1 or 2T-2C configurations of the type described in FIG. 2. Each memory cell may be uniquely addressed by the combination of a bitline and a wordline within the memory array 10.

Figure 4:
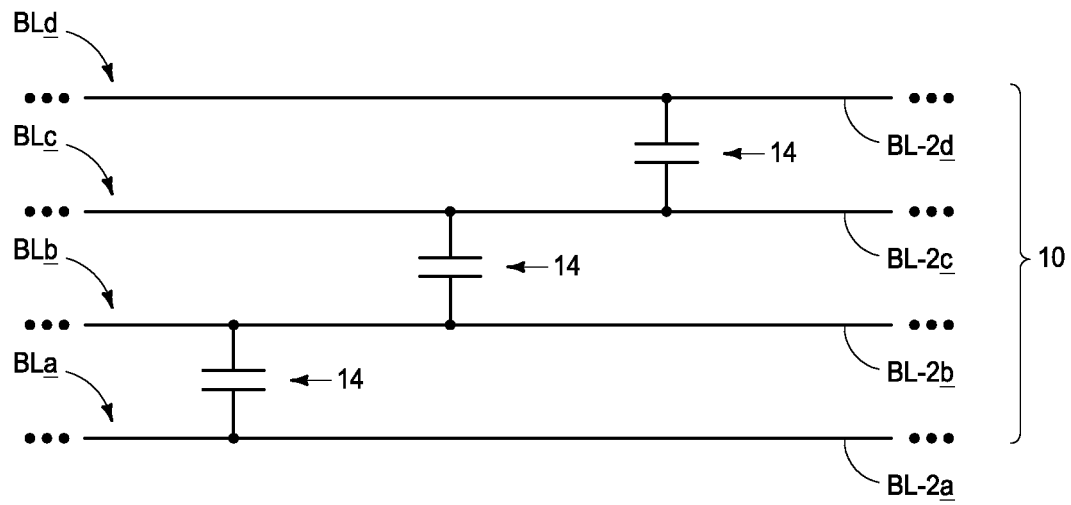
FIGS. 4 and 5 are a diagrammatic top view and bottom view, respectively, of bitlines of the memory array region of FIG. 3 showing problematic capacitance that may occur between adjacent bitlines.
Figure 5:
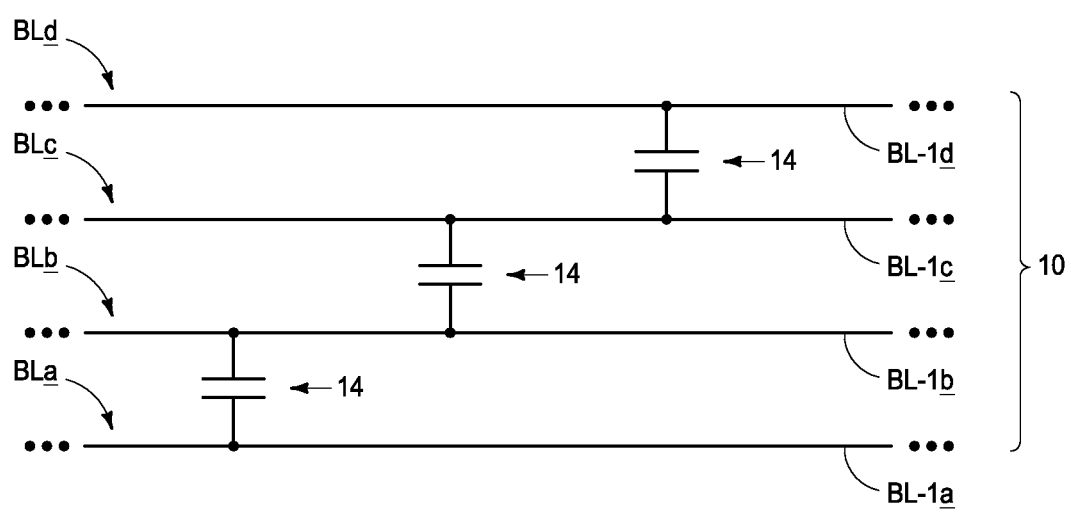

FIGS. 4 and 5 show top and bottom views, respectively, of the bitlines and illustrate problematic parasitic capacitance that may occur during operation of the memory array 10. The parasitic capacitance is diagrammatically illustrated with schematic representations of capacitors 14 forming between adjacent bitlines during operation of the memory array. For instance, if bitline BLb is activated during a READ operation, such may problematically lead to parasitic capacitance between the bitline component BL-1b and the adjacent bitline components BL-1a and BL-1c; and/or may problematically lead to parasitic capacitance between the bitline component BL-2b and the adjacent bitline components BL-2a and BL-2c. Similarly, operations associated with other bitlines may lead to similar parasitic capacitance between active bitlines and adjacent bitlines.

The parasitic capacitance becomes increasingly problematic with increasing integration and associated tighter packing of bitlines within a memory array. The parasitic capacitance may problematically impede operability of a memory array by leading to undesired crosstalk between adjacent bitlines, and/or otherwise creating undesired effects, such as noise, during operation of the array. Accordingly, it is desired to alleviate, and preferably prevent, such parasitic capacitance.

Figure 6:
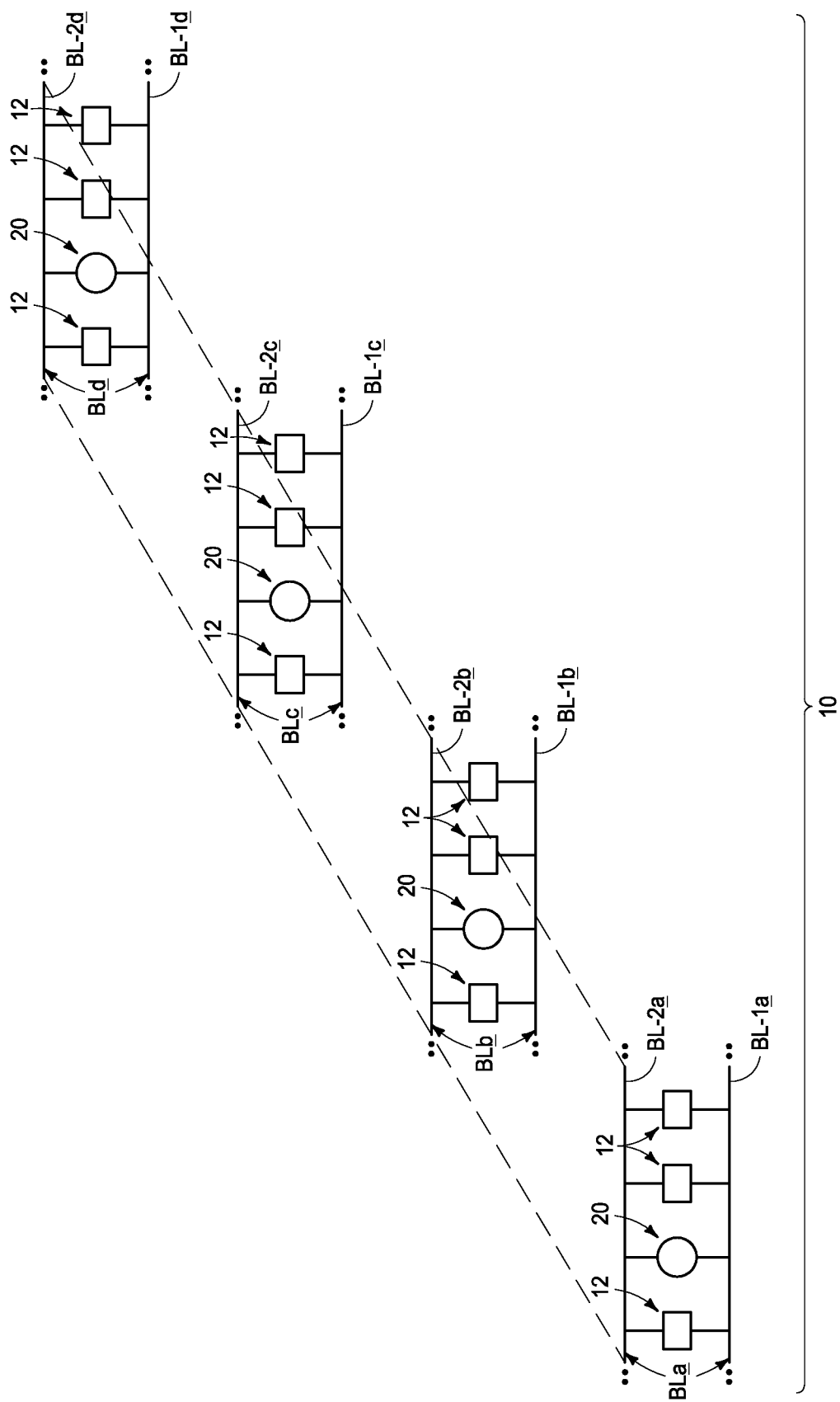
FIG. 6 is a diagrammatic view of a region of an example embodiment memory array showing an arrangement of memory cells and capacitive elements along bitlines.

FIG. 6 shows memory array 10 of FIG. 3 containing modifications in accordance with an example embodiment. Specifically, some of the memory cells 12 along the bitlines BLa-BLd are replaced with capacitive units 20. Such capacitive units are interspersed with the memory cells along the columns of the memory array, and may be utilized for tailoring electrical properties of the bitlines in order to alleviate or prevent the problematic parasitic capacitance described above with reference to FIGS. 4 and 5. Wordlines (not shown in FIG. 6) may extend orthogonally to the bitlines, as described below with reference to FIG. 8.

The capacitive units 20 of FIG. 6 may be utilized to adjust voltage or other electrical properties along the bitlines to alleviate parasitic capacitance between adjacent bitlines of the memory array, while still enabling suitable differences to remain between the comparative bitline components of the individual bitlines so that memory states of the memory cells are maintained and may be appropriately ascertained during a READ operation. In some embodiments the capacitive units may be passive and maintained in an "on" (i.e. "powered" or "operative") state whenever power is provided to the memory array. In other embodiments the capacitive units may be selectable so that they are maintained in an operative state only during particular operations. For instance, the capacitive units along a particular bitline may be powered only during activation (i.e. reading) of memory cells, and may be non-powered during writing to the memory cells. It may be advantageous to have the capacitive units along a bitline non-powered during writing of the memory cells associated with the bitline if it is found that the capacitive units otherwise interfere with the writing operation. Alternatively, if it is found that the capacitive units do not interfere with the writing operation when the capacitive units are powered, it may be advantageous to have the capacitive units throughout a memory array continuously "on" whenever power is provided to the memory array as such may simplify fabrication and/or operation of the memory array. Specific operative configurations are described below with reference to FIGS. 9 and 10.

Continuing the description of FIG. 6, the illustrated embodiment shows that every column of the memory array has a capacitive unit 20, with the capacitive units being in a common row as one another. In some embodiments, columns of the memory array may have two or more of the capacitive units, with a same number of capacitive units being provided along each of the individual columns of the memory array and with the capacitive units being arranged in rows analogous to the row shown in FIG. 6.

The capacitive units 20 may have any suitable configuration. In some embodiments the capacitive units may have identical components as the memory cells 12, and may differ from the memory cells only in a method of operation. Such may simplify fabrication of the capacitive units in that the capacitive units may be fabricated identically to the memory cells. For instance, in some embodiments the memory cells 12 may be 2T-1C memory cells, and the capacitive units may each comprise two transistors and a capacitor in a same configuration as the memory cells, as described with reference to FIG. 7.

Figure 7:
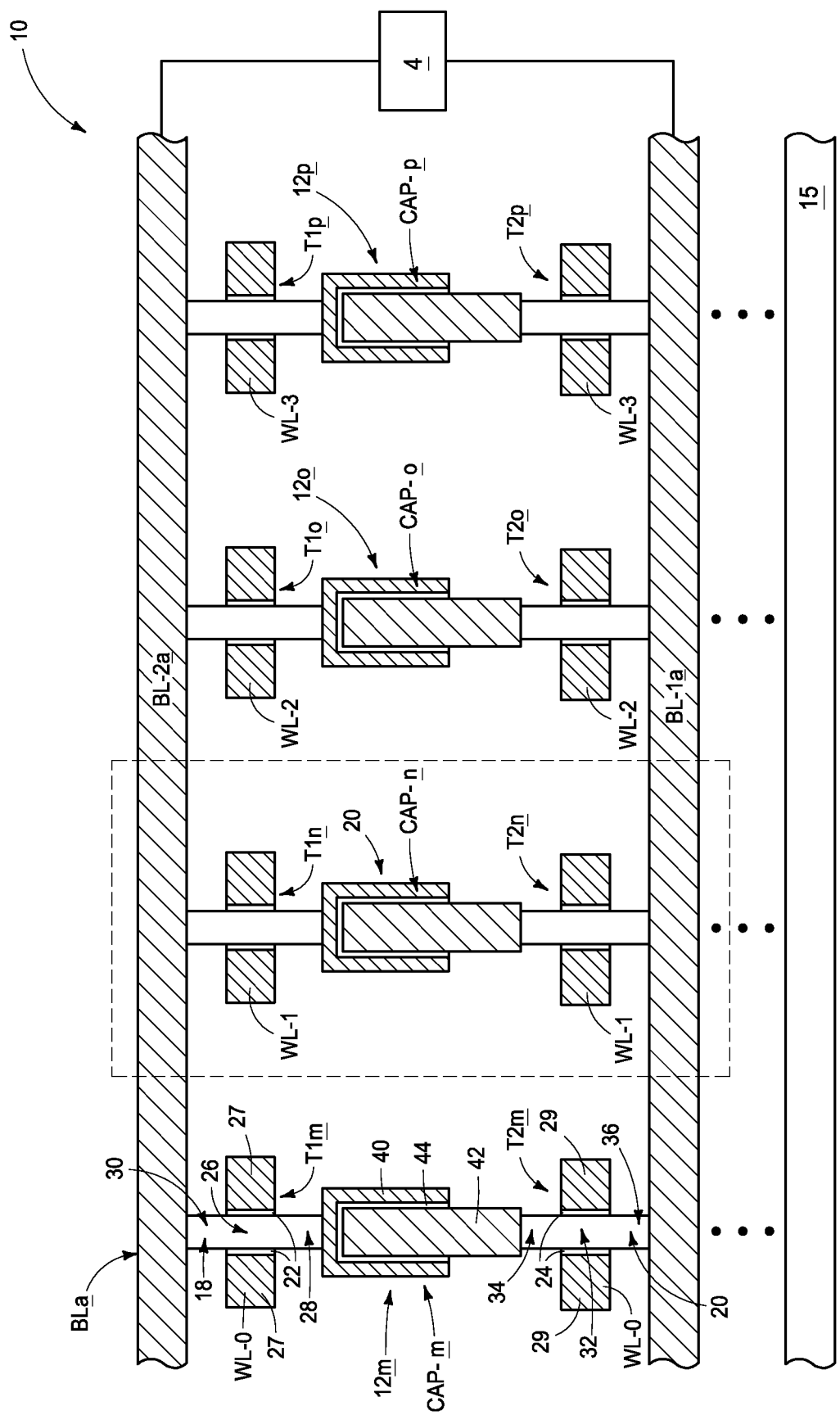
FIG. 7 is a diagrammatic cross-sectional side view of a region of a memory array showing an example configuration for memory cells and capacitive elements.

FIG. 7 shows a region of the bitline BLa of memory array 10 in an example embodiment in which each of the memory cells 12 comprises a first transistor T1, a second transistor T2, and a capacitor CAP. The bitline BLa is shown in a same configuration as in FIG. 6, and accordingly has a capacitive unit 20 and three memory cells 12. The memory cells are labeled as 12m, 12o and 12p in order to distinguish the memory cells from one another. The capacitive unit 20 is between the memory cells 12m and 12o, and like the memory cells comprises a capacitor CAP between first and second transistors T1 and T2.

The capacitors of the memory cells 12m, 12o and 12p are labeled as capacitors CAP-m, CAP-o and CAP-p, respectively; and the capacitor of capacitive unit 20 is labeled as capacitor CAP-n. The first transistors of memory cells 12m, 12o and 12p are labeled as transistors T1m, T1o and T1p, respectively; and the first transistor of capacitive unit 20 is labeled as T1n. The second transistors of memory cells 12m, 12o and 12p are labeled as transistors T2m, T2o and T2p, respectively; and the second transistor of capacitive unit 20 is labeled as T2n. The memory cell 12m comprises the transistors T1m and T2m along a wordline WL-0, the capacitive unit 20 comprises the transistors T1n and T2n along a wordline WL-1, the memory cell 12o comprises the transistors T1o and T2o along a wordline WL-2, and memory cell 12p comprises the transistors T1p and T2p along a wordline WL-3.

The memory cells 12m, 12o and 12p all have a common configuration as one another, and the capacitive unit 20 shares such common configuration. In some embodiments, the memory cells 12m, 12o and 12p, and the capacitive unit 20, may be referred to as being substantially identical to one another, with the term "substantially identical" meaning that the memory cells and the capacitive unit are identical to one another within reasonable tolerances of fabrication and measurement. Particular components of the memory cells are described and labeled with reference to the cell 12m, and it is to be understood that the same components may be utilized in the other memory cells and the capacitive unit.

The capacitor CAP-m comprises a first node 40, a second node 42 and capacitor dielectric material 44 between the first and second nodes. The first node 40 is shown to be container-shaped, and the second node 42 is shown to extend within such container shape. In other embodiments the first and second nodes may have other configurations. For instance, the first and second nodes may have planar configurations, with the capacitor dielectric material 44 being a planar configuration provided between the planar first and second nodes. In the illustrated configuration the first node 40 may be referred to as an outer node and the second node 42 may be referred to as an inner node.

A semiconductor pillar 18 extends from comparative bitline component BL-2a to the outer node 40 of capacitor CAP-m, and a semiconductor pillar 20 extends from the comparative bitline component BL-la to the inner node 42 of the capacitor. Such semiconductor pillars may comprise any suitable semiconductor materials including, for example, one or both of silicon and germanium.

The transistor T1m has a first source/drain region 28 extending to the first node 40 of capacitor CAP-m, a second source/drain region 30 extending to comparative bitline BL-2a, and a channel region 26 between the first and second source/drain regions. A transistor gate 27 is along the channel region and offset from the channel region by gate dielectric material 22.

The transistor T2 has a third source/drain region 34 extending to the second node 42 of capacitor CAP-m, a fourth source/drain region 36 extending to the comparative bitline component BL-1a, and a channel region 32 between the third and fourth source/drain regions. A transistor gate 29 is along the channel region and offset from the channel region by gate dielectric material 24.

The wordline WL-0 is common to the first and second transistors T1m and T2m, and comprises the gates 27/29. The wordline WL-0 (and the wordlines WL-1, WL-2 and WL-3) may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The bitline BLa may comprise a same conductive material was the wordlines, or may comprise a different conductive material.

The gate dielectric materials 22 and 24 may comprise any suitable compositions or combinations of compositions; including, for example, silicon dioxide, silicon nitride, high-K dielectric material, ferroelectric material, etc.

The source/drain regions and channel regions of the T1 and T2 transistors may be doped with any suitable dopants.

In some embodiments, the source/drain regions may be n-type majority doped, and in other embodiments may be p-type majority doped.

The first and second transistors (T1 and T2) of the memory cells and capacitive unit may be considered to be vertically displaced relative to one another, and the capacitors of the memory cells and capacitive unit are vertically between the first and second transistors (for instance, the transistors T1m and T2m of memory cell 12m are vertically displaced relative to one another, and the capacitor CAP-m is vertically between such transistors). In the illustrated embodiment, each of the individual memory cells and the individual capacitive unit has the transistors and capacitor in a common vertical plane (for instance, the capacitive unit 20 has the transistors T1n/T2n and capacitor CAP-n in a common vertical plane as one another). In other embodiments, the transistors and capacitors of the memory cells and/or capacitive units may have other configurations.

The illustrated capacitors CAP-m, CAP-n, CAP-o and CAP-p in the embodiment of FIG. 7 may be replaced with other capacitive structures in other embodiments. For instance, any of the capacitors may be replaced with a capacitive structure having two or more capacitors in combination.

The memory array 10 is shown to be supported by a base 15. The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc. The base is shown to be spaced from components of array 10 to indicate that other circuitry or components may be between array 10 and the base. For instance, circuitry 4 may be between the memory array 10 and the base 15 in some embodiments. Circuitry 4 may be incorporated into the base 15 as a sense amplifier together with other electrical circuits that may be used to access to the array 10 to read or write data from or into the array 10. In some embodiments, in applications where an interlayer insulating film intervenes between the array 10 and the base 15, a plurality of vias are formed in the interlayer insulating film to electrically connect wordlines WL-0, WL-1, WL-2 and WL-3 and bitlines BL-1a and BL-2a of the array 10 to the circuits such as the sense amplifiers 4, that are formed in the base 15.

The illustrated memory array configuration of FIG. 7 utilizes 2T-1C memory cells. In other embodiments analogous configurations may utilize other types of memory cells, such as, for example, 2T-2C memory cells.

The illustrated memory array configuration of FIG. 7 utilizes a capacitive unit 20 which is substantially identical to the memory cells (12m, 12o and 12p). In other embodiments the capacitive unit may be different from the memory cells. Regardless of whether the capacitive unit is substantially identical to memory cells or not, a difference between the capacitive unit and the memory cells is that the capacitive unit is not utilized for data storage during operation of the memory array. Instead, the capacitive unit is utilized for reducing parasitic coupling between adjacent bitlines.

In the illustrated embodiment of FIG. 7 the capacitive unit 20 may be operated (i.e., placed in an "on" state) by powering the wordline WL-1 and thereby powering both of the transistors T1n and T2n (i.e., placing both of transistors T1n and T2n in an "on" state).

Figure 8:
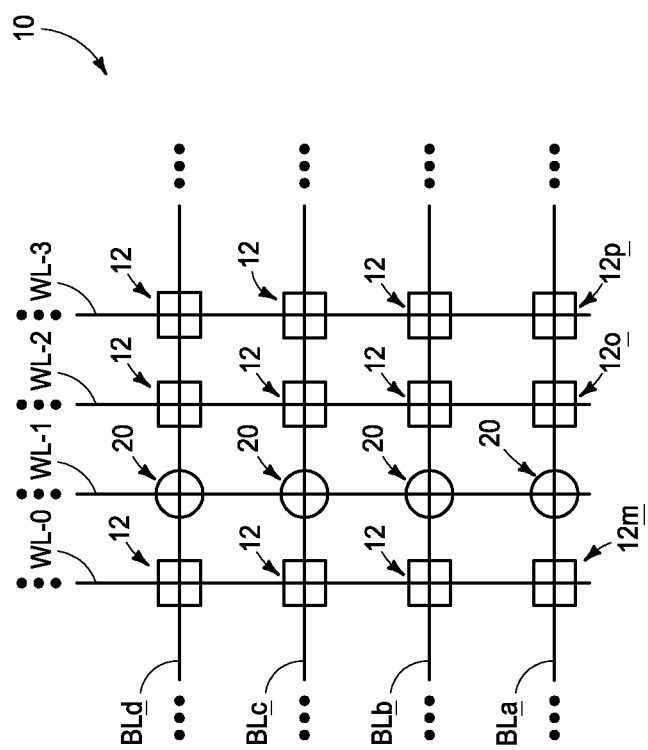
FIG. 8 is a diagrammatic top view of an example embodiment memory array comprising a column corresponding to the arrangement shown in FIG. 7. The array of FIG. 8 is identical to that described above with reference to FIG. 6.

FIG. 8 shows a top view of a portion of a memory array 10 comprising columns corresponding to bitlines BLa, BLb, BLc and BLd, and comprising wordlines corresponding to the wordlines WL-0, WL-1, WL-2 and WL-3. The column corresponding to bitline BLa is identical to the column shown in FIG. 7, and comprises the memory cells 12m, 12o and 12p together with the capacitive unit 20. The other columns also comprise memory cells 12 and capacitive units 20.

The memory array of FIG. 8 may be operated in any suitable manner. In some embodiments at least some of the capacitive units 20 associated with the memory array may be maintained in the "on" state whenever any region of the memory array 10 is utilized for any operation, and may be considered to be "passive" in that the capacitive units are not controlled other than simply powering them on when the memory array is utilized. In some embodiments at least some of the capacitive units associated with a memory array may be selectively activated during particular operations, and otherwise left in an "off" state, and in such embodiments the capacitive units may be considered to be "active" or "selectable". For instance, in some embodiments capacitive units may be maintained in an "on" state during READ operations associated with memory cells of the array, and otherwise the capacitive units are in an "off" state. Selectively utilizing capacitive units during READ operations associated with memory cells of a memory array, and leaving the capacitive units "off" during WRITE operations associated with the memory cells, may be advantageous in some embodiments in that such may alleviate problematic parasitic capacitance during the READ operations and yet avoid possible interference the capacitive units may create during WRITE operations. Example operative arrangements of capacitive units are described with reference to FIGS. 9 and 10.

Figure 9:
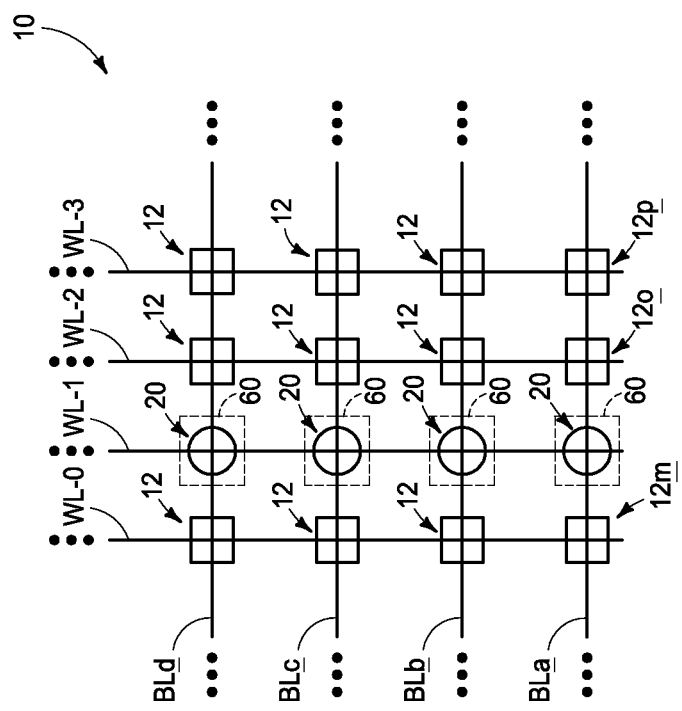

Referring to FIG. 9, a portion of the memory array 10 of FIG. 6 is shown in top view. The memory array is powered, but none of the columns BLa, BLb, BLc or BLd is being utilized in a READ operation. Yet, all of the capacitive units 20 are powered (i.e., in an "on" state), as diagrammatically illustrated by a dashed-boxes 60 being provided around the capacitive units. One or more of the columns BLa, BLb, BLc or BLd may be being utilized in a programming operation at the operational stage of FIG. 9, but regardless are not being utilized in a READ operation.

Figure 10:
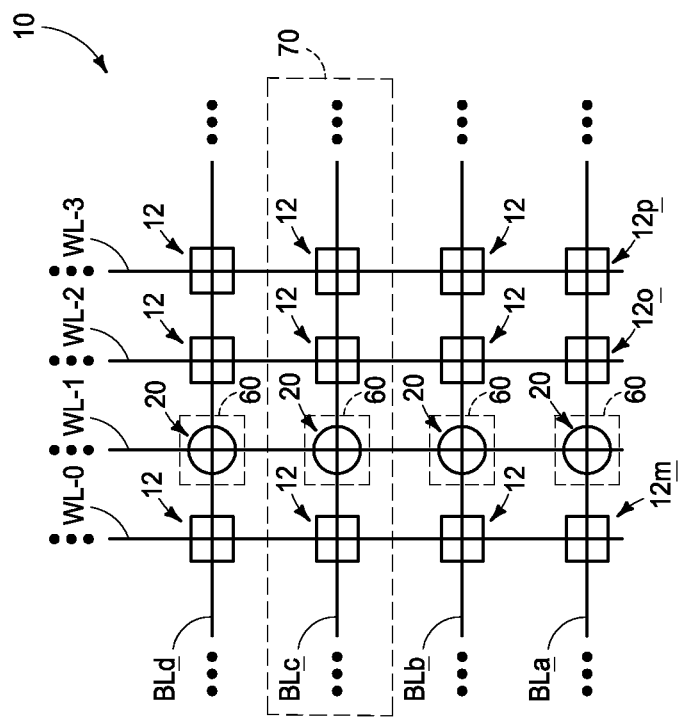
FIGS. 9 and 10 are diagrammatic top views of the example embodiment memory array of FIGS. 6 and 8 showing example operative arrangements that may be utilized with capacitive elements.

FIG. 10 shows the portion of memory array 10 in an operation in which memory cells 12 along the bitline BLc are part of a READ operation, as indicated by a dashed box 70 around the bitline BLc. The capacitive unit 20 associated with bitline BLc is powered (as indicated by dashed box 60). The other capacitive units along wordline WL-1 are also powered due to power being provided along WL-1. It is noted that having the capacitive units 20 in columns immediately adjacent BLc (i.e., columns BLb and BLd) in the "on" state may assist in reducing parasitic coupling between column BLc and the immediately adjacent columns during the reading of memory cells along BLc.

The structures and architectures described above may be incorporated into memory (e.g., DRAM, SRAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array having a series of bitlines. Each of the bitlines has a first comparative bitline component and a second comparative bitline component. The bitlines define columns of the memory array. Memory cells are along the columns of the memory array. Capacitive units are along the columns of the memory array and are interspersed amongst the memory cells.

Some embodiments include a memory array having a series of bitlines. Each of the bitlines has a first comparative bitline component and a second comparative bitline component. The bitlines define columns of the memory array. Memory cells are along the columns of the memory array. Individual memory cells comprise first and second transistors vertically displaced relative to one another, and a capacitor between the first and second transistors. The capacitor has a first node electrically coupled with a source/drain region of the first transistor, has a second node electrically coupled with a source/drain region of the second transistor, and has capacitor dielectric material between the first and second nodes. The first and second transistors are coupled to a common wordline. Capacitive units are along the columns of the memory array. Individual capacitive units comprise identical components as the individual memory cells but not being utilized for data storage during operation of the memory array. An individual capacitive unit along an individual column being maintained in an "on" state when said individual column is utilized in a READ operation.

Some embodiments include a memory array having a series of bitlines. Each of the bitlines has a first comparative bitline component and a second comparative bitline component. The bitlines define columns of the memory array. Memory cells are along the columns of the memory array. Individual memory cells comprise first and second transistors vertically displaced relative to one another, and a capacitor between the first and second transistors. The capacitor has a first node electrically coupled with a source/drain region of the first transistor, has a second node electrically coupled with a source/drain region of the second transistor, and has capacitor dielectric material between the first and second nodes. The first and second transistors are coupled to a common wordline. Capacitive units are along the columns of the memory array. Individual capacitive units comprise identical components as the individual memory cells but are not utilized for data storage during operation of the memory array. An individual capacitive unit is maintained in an "on" state whenever power is provided to the memory array.

Some embodiments include an apparatus having a semiconductor base, a memory array, and an insulating film intervening between the semiconductor base and the memory array. The memory array includes a plurality of memory cells, a pair of bitlines, and at least one capacitive unit, and each of the plurality of memory cells is provided between the pair of bit lines. Each of the memory cells comprises a first transistor and a first capacitor. The first transistor and the first capacitor are vertically disposed between the pair of bitlines. The at least one capacitive unit is disposed between the pair of bitlines and activated at least when one of the memory cells is accessed to read data therefrom.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising:
   a semiconductor substrate;
   a first comparative bitline extending horizontally over the semiconductor substrate;
   a second comparative bitline extending horizontally over the semiconductor substrate and being aligned vertically with the first comparative bitline;
   a plurality of memory cells each comprising a first transistor and a first capacitor that are arranged vertically between the first and second comparative bitlines;
   a capacitive unit comprising a second transistor and a second capacitor that are arranged vertically between the first and second comparative bitlines; and
   wherein the second transistor of the capacitive unit is configured to be turned on when the first transistor of a selected one of the plurality of memory cells is turned on.

2. The apparatus of claim 1 wherein the first and second comparative bitlines are along a column of a memory array; wherein the capacitive unit is one of many substantially identical capacitive units within the memory array; wherein the column is one of many columns of the memory array; and wherein every column has one of the capacitive units.

3. The apparatus of claim 2 wherein every column has two or more of the capacitive units.

4. The apparatus of claim 2 wherein a row of the memory array extends orthogonally to the columns; and wherein the capacitive units are all along the row.

5. The apparatus of claim 1 wherein the capacitive unit comprises a third transistor on an opposing side of the capacitor from the first transistor, and vertically between the first and second comparative bitlines.

6. A memory array comprising:
   a series of bitlines, each of the bitlines having a first comparative bitline component and a second comparative bitline component; the bitlines defining columns of the memory array;
   memory cells along the columns of the memory array; individual memory cells comprising a transistor and a capacitor; and
   capacitive units along the columns of the memory array; individual capacitive units being configured identically to the individual memory cells but not being utilized for data storage during operation of the memory array, an individual capacitive unit along an individual column being maintained in an "on" state when said individual column is utilized in a READ operation.

7. The memory array of claim 6 wherein said individual capacitive unit is not maintained in the "on" state when said individual column is utilized in a WRITE operation.

8. The memory array of claim 6 wherein said individual capacitive unit is maintained in the "on" state when said individual column is utilized in a WRITE operation.

9. The memory array of claim 6 wherein said individual capacitive unit is along a row of capacitive units.

10. The memory array of claim 9 wherein said individual capacitive unit is also maintained in the "on" state when any column crossing said row is utilized in a READ operation.

11. The memory array of claim 6 wherein the transistor and capacitor of the individual memory cells and the individual capacitive units are all in a common vertical plane as one another.

12. The memory array of claim 6 wherein the columns of the memory array have two or more of the capacitive units.

13. A memory array comprising:
   a series of bitlines supported by a base, each of the bitlines having a first comparative bitline component and a second comparative bitline component; the bitlines defining columns of the memory array; the first and second comparative bitline components extending to a sense amplifier supported by the base and being under the first and second comparative bitline components;
   memory cells along the columns of the memory array; individual memory cells comprising first and second transistors vertically displaced relative to one another, and a capacitor between the first and second transistors; the capacitor having a first node electrically coupled with a source/drain region of the first transistor, having a second node electrically coupled with a source/drain region of the second transistor, and having capacitor dielectric material between the first and second nodes; the first and second transistors being coupled to a common wordline; and
   capacitive units along the columns of the memory array; the capacitive units being configured identically to the memory cells but not being utilized for data storage during operation of the memory array, the capacitive units being maintained in an "on" state whenever power is provided to the memory array.

14. The memory array of claim 13 wherein the capacitive units are arranged along a row which extends orthogonally to the columns.

15. The memory array of claim 13 wherein the first transistor, second transistor and capacitor of the individual memory cells are all in a common vertical plane as one another.

16. The memory array of claim 13 wherein each of the columns of the memory array has two or more of the capacitive units.

\* \* \* \* \*